(12) United States Patent
Reinprecht

(10) Patent No.: US 9,397,495 B2
(45) Date of Patent: Jul. 19, 2016

(54) CIRCUIT ARRANGEMENT FOR PROTECTING AGAINST ELECTROSTATIC DISCHARGES

(75) Inventor: Wolfgang Reinprecht, Tobelbad (AT)

(73) Assignee: AMS AG, Unterpremstaetten (AT)

( * ) Notice: Subject to any disclaimer, the term of this patent is extended or adjusted under 35 U.S.C. 154(b) by 243 days.

(21) Appl. No.: 14/237,165

(22) PCT Filed: Jul. 30, 2012

(86) PCT No.: PCT/EP2012/064887
§ 371 (c)(1),
(2), (4) Date: May 13, 2014

(87) PCT Pub. No.: WO2013/020853
PCT Pub. Date: Feb. 14, 2013

(65) Prior Publication Data
US 2014/0240877 A1    Aug. 28, 2014

(30) Foreign Application Priority Data

Aug. 5, 2011   (DE) .................. 10 2011 109 596

(51) Int. Cl.
*H02H 9/04*    (2006.01)
*H01L 27/02*   (2006.01)
(52) U.S. Cl.
CPC ........... *H02H 9/044* (2013.01); *H01L 27/0285* (2013.01); *H02H 9/046* (2013.01)
(58) Field of Classification Search
CPC ..... H02H 9/044; H02H 9/046; H01L 27/0285
USPC .......................................................... 361/56
See application file for complete search history.

(56) References Cited

U.S. PATENT DOCUMENTS

| 5,255,146 | A | * | 10/1993 | Miller | .................... | H02H 9/046 |
| | | | | | | 361/111 |
| 5,946,177 | A | | 8/1999 | Miller et al. | | |
| 6,249,410 | B1 | * | 6/2001 | Ker | ..................... | H01L 27/0251 |
| | | | | | | 361/111 |
| 6,388,850 | B1 | * | 5/2002 | Ker | ........................ | H02H 9/046 |
| | | | | | | 361/56 |
| 2006/0061929 | A1 | | 3/2006 | Duvvury et al. | | |
| 2006/0250732 | A1 | | 11/2006 | Peachey | | |
| 2007/0024772 | A1 | | 2/2007 | Childers et al. | | |
| 2008/0239601 | A1 | | 10/2008 | Miyazawa et al. | | |
| 2008/0285199 | A1 | | 11/2008 | Deutschmann et al. | | |
| 2009/0128969 | A1 | | 5/2009 | Deval et al. | | |
| 2012/0162833 | A1 | * | 6/2012 | Russ | ...................... | H02H 9/046 |
| | | | | | | 361/56 |

FOREIGN PATENT DOCUMENTS

CN        1918707 A      2/2007
DE    102004007241 A1   9/2005
(Continued)

*Primary Examiner* — Thienvu Tran
*Assistant Examiner* — Kevin J Comber
(74) *Attorney, Agent, or Firm* — McDermott Will & Emery LLP

(57) ABSTRACT

A circuit arrangement for protecting against electrostatic discharges comprises a diverter (ECL) that is suitable for diverting an electrostatic discharge between a first terminal (IO) and a second terminal (VDD, VSS), as well as a compensation device (1). The compensation device (1) features a series circuit of a first resistor (RS) and a field effect transistor (T1) that is connected between the first terminal (IO) and the second terminal (VDD, VSS). A junction (K1) between the first resistor (RS) and the field effect transistor (T1) is connected to the gate terminal (G1) of the field effect transistor (T1) via an RC series circuit that acts as a low-pass filter.

14 Claims, 2 Drawing Sheets

(56) References Cited

361/56

FOREIGN PATENT DOCUMENTS

Figure 1:
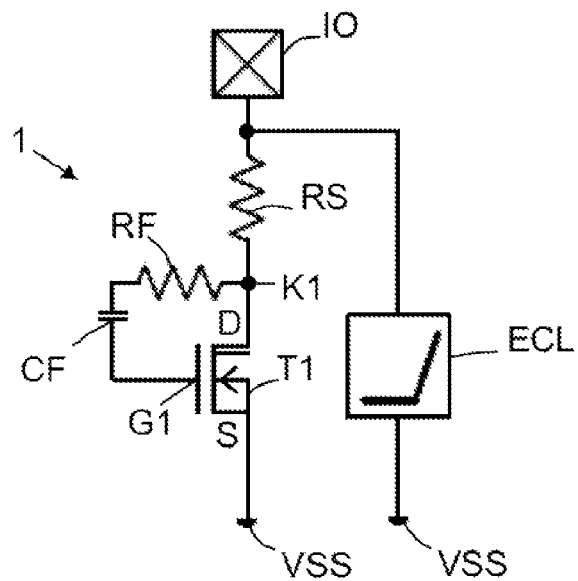

| DE | 102008001368 A1 | 10/2009 |
| JP | 58147068 | 9/1983 |
| JP | 2007096150 A | 4/2007 |
| JP | 2008251755 A | 10/2008 |
| JP | 2009152484 A | 7/2009 |
| JP | 2009534845 A | 9/2009 |
| WO | WO-2004073023 A2 | 8/2004 |

* cited by examiner

CIRCUIT ARRANGEMENT FOR PROTECTING AGAINST ELECTROSTATIC DISCHARGES

The invention relates to a circuit arrangement for protecting against electrostatic discharges.

Integrated circuits can be seriously damaged or even destroyed by electrostatic discharges. An electrostatic discharge or ESD causes an overvoltage to be generated, for example, at a terminal of the integrated circuit, wherein said overvoltage can cause a high current flow through the circuit. If individual components of the integrated circuit are not designed for such a high current flow, the corresponding component and therefore possibly the entire integrated circuit may be damaged.

This is the reason why integrated circuits are increasingly provided with ESD protective gear that forms a separate current path when an electrostatic discharge occurs in order to divert the discharge. Such protective gear is triggered, for example, by exceeding a threshold voltage or by the occurrence of pulsed overvoltages.

In order to achieve a sufficient protection against electrostatic discharges, corresponding trigger circuits with high sensitivities are used. When an ESD pulse occurs, however, voltage increases may occur prior to the actual overvoltage pulse and impair the reliability of the protective gear. Such voltage increases may respectively also occur, in particular, in tests or in test devices, by means of which the ESD stability of an integrated circuit is tested. This can lead to a limited validity of such tests. It is furthermore possible that the response characteristic of conventional ESD protective gear is insufficient such that the integrated circuit is protected against electrostatic discharges with limited reliability.

An objective to be achieved consists of disclosing a more reliable concept for protecting against electrostatic discharges.

This objective is achieved with the subject-matter of the independent claim. Embodiments and enhancements form the subject-matter of the dependent claims.

For example, one embodiment of a circuit arrangement for protecting against electrostatic discharges also comprises a compensation device that is connected between a first and a second terminal, in addition to a diverter suitable for diverting an electrostatic discharge between the first terminal and the second terminal. The diverter features, for example, a bypass transistor with separate or integrated triggering. The compensation device is designed, for example, for monitoring a voltage progression between the first and the second terminal and for diverting overvoltages that occur, for example, due to charges prior to an electrostatic discharge. However, an actual electrostatic discharge is preferably diverted by the diverter. In particular, the response characteristic of the diverter is improved due to the diverted pre-charges.

According to one embodiment of the circuit arrangement, the compensation device features a series circuit of a first resistor and a field effect transistor that is connected between the first terminal and the second terminal. A junction between the first resistor and the field effect transistor is connected to the gate terminal of the field effect transistor via an RC series circuit that comprises a second resistor and a capacitor. The RC series circuit acts as a low-pass filter between the aforementioned junction and the gate terminal of the field effect transistor.

When the field effect transistor is activated during the operation of the circuit arrangement by a corresponding voltage at the gate terminal, an overvoltage occurring, for example, due to a pre-charge of the first terminal can be diverted to the second terminal in a controlled fashion via the first resistor and the controlled path of the field effect transistor. The diversion is realized in particular by means of a leakage current that is defined, in particular, by a value of the first resistor. For example, a value of no more than 1 kΩ is chosen for the first resistor in order to realize a current limiting for the field effect transistor, as well as to allow a sufficient and reliable diversion of the overvoltage.

For example, the overvoltage or pre-charge voltage caused by a pre-charge of the first terminal lies on the order of a few tens of volts. In the worst-case scenario, the bias voltage may increase as far as slightly below the breakdown voltage of the ESD protective circuit.

The first resistor that causes a current limiting for the controlled path of the field effect transistor also prevents, for example, a voltage snap-back of the field effect transistor.

The capacitor of the RC series circuit acts as a Miller capacitance that causes low-frequency voltages at the first terminal that can activate the field effect transistor while higher-frequency signals are respectively filtered out or filtered away and therefore cannot lead to an activation of the field effect transistor. In comparison with an ESD pulse, for example, a pre-charge voltage in terms of time acts like a direct voltage because the pre-charge has a longer duration than the actual ESD pulse.

When the field effect transistor is activated, for example, the voltage at the first terminal is discharged at least to the threshold voltage of the field effect transistor.

In different embodiments, the RC series circuit is dimensioned in such a way that a pulse of an electrostatic discharge at the first terminal is filtered out or filtered away with respect to the gate terminal of the field effect transistor. For example, the rise time of an ESD pulse amounts to approximately 20 nsec. In this case, the capacitor and the second resistor can be dimensioned such that the resulting time constant of the RC series circuit is longer than a conventional rise time of an ESD pulse.

In other embodiments, the RC series circuit is dimensioned in such a way that an edge of a useful signal, particularly with a rate of rise that is known in advance, is filtered out or filtered away with respect to the gate terminal of the field effect transistor at the first terminal. For example, the first terminal is an input/output terminal, by means of which pulsed useful signals can be transmitted. The signal form of such pulsed useful signals is usually defined within certain limits such that the rise time of a signal edge of the useful signal is at least approximately known. The capacitor and the second resistor may be accordingly chosen such that the pulsed useful signal does not reach the gate terminal of the field effect transistor due to the edge steepness, and an activation of the field effect transistor by the useful signal is therefore precluded.

The dimensioning of the RC series circuit, particularly in terms of a limiting frequency of the low-pass filter, may take place, in particular, with respect to an ESD pulse, as well as with respect to a pulsed useful signal, such that the desired behavior is achieved for both instances.

In different embodiments of the circuit arrangement, the second terminal is a reference potential terminal or a supply voltage terminal. For example, the field effect transistor is realized in the form of an n-channel field effect transistor, wherein a diversion is in this case carried out from the first terminal to a second terminal that is realized in the form of a reference potential terminal or ground terminal. In other embodiments, the field effect transistor is realized in the form of a p-channel field effect transistor, wherein a diversion to a supply voltage terminal takes place in this case.

The field effect transistor may be suitable for low-voltage applications or high-voltage applications. Depending on the developing technologies, low-voltage applications concern, for example, maximum voltages of 5 V, 3.3 V or 1.8 V at the gate terminal of the field effect transistor. In contrast to the low-voltage range, however, a high-voltage range can generally be defined in that an expected operating voltage of a circuit, particularly an integrated circuit, lies above the breakdown voltage of the gate oxide of the field effect transistor. In the case of a high-voltage application, it may therefore be desirable to carry out a voltage limitation at the gate terminal of the field effect transistor.

In one embodiment of the circuit arrangement, the compensation device accordingly features a voltage limiter that is connected between the gate terminal of the field effect transistor and the second terminal. The voltage limiter is designed for maintaining a gate voltage of the field effect transistor lower than a gate breakdown voltage of the field effect transistor. In this way, a safe and reliable operation of the circuit arrangement can also be ensured in high-voltage applications.

In different embodiments, for example, the voltage limiter features for this purpose a series circuit of several diodes or transistors wired in the form of a diode. In this case, each of these diodes or each of these transistors wired in the form of a diode has a defined conducting-state voltage such that the resulting limiting value at the gate terminal of the field effect transistor is the sum of the individual conducting-state voltages. Consequently, the number of required diodes or transistors wired in the form of a diode can be determined based on a desired limiting voltage and a known conducting-state voltage.

In different embodiments, the circuit arrangement is designed for protecting an integrated circuit, in particular in the non-installed state, while no such protection is desired or required in the installed state. For example, a protection against electrostatic discharges caused by a person who contacts a terminal is predominantly required in the non-installed state of the integrated circuit.

In another embodiment, the circuit arrangement features, for example, a deactivation device that is designed for connecting the gate terminal of the field effect transistor and the second terminal, in particular in a low-resistance fashion based on a deactivation signal. Due to the connection of the gate terminal to the second terminal, an activation of the field effect transistor and therefore the realization of a conductive channel between the first and the second terminal are prevented. Accordingly, the compensation device can be deactivated by means of a corresponding deactivation signal.

For example, the deactivation device features a switching transistor that connects the gate terminal of the field effect transistor to the second terminal. The compensation device is accordingly deactivated when the switching transistor is activated.

In different embodiments, the switching transistor can be controlled in this respect by means of a bias current. For example, such a bias current is delivered by a bias current source that, for example, may form part of an integrated circuit to be protected. The bias current that activates the switching transistor is delivered in particular when a sufficient operating voltage is available.

The switching transistor can also be controlled based on a voltage at a supply voltage terminal. For example, a Power-on-Reset or POR circuit is provided and delivers a corresponding digital signal that indicates an operating state of the circuit when a sufficient operating voltage is available. The switching transistor can be activated with this digital signal in order to deactivate the compensation device.

The different described embodiments can be arbitrarily combined in order to obtain a circuit arrangement that is respectively adapted to the intended use, particularly an adapted compensation device.

Several embodiment examples of the invention are described in greater detail below with reference to the figures. In these figures, elements with respectively identical function or operation are identified by the same reference symbols. The descriptions and explanations of elements of one figure also apply to elements identified by the same reference symbols in the ensuing figures.

Figure 2:
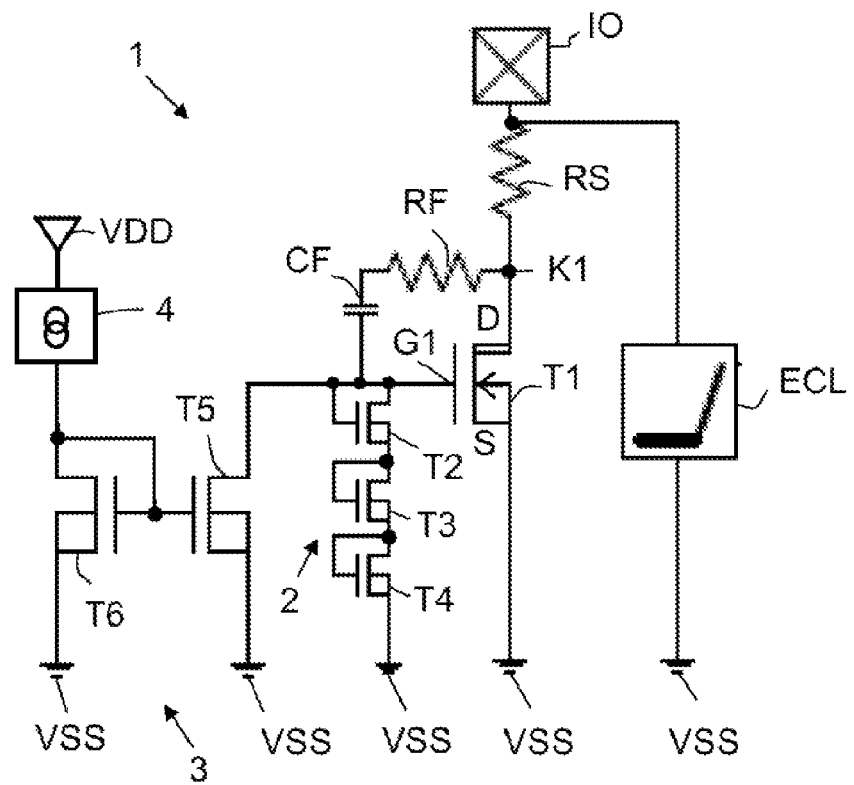
Figure 3:
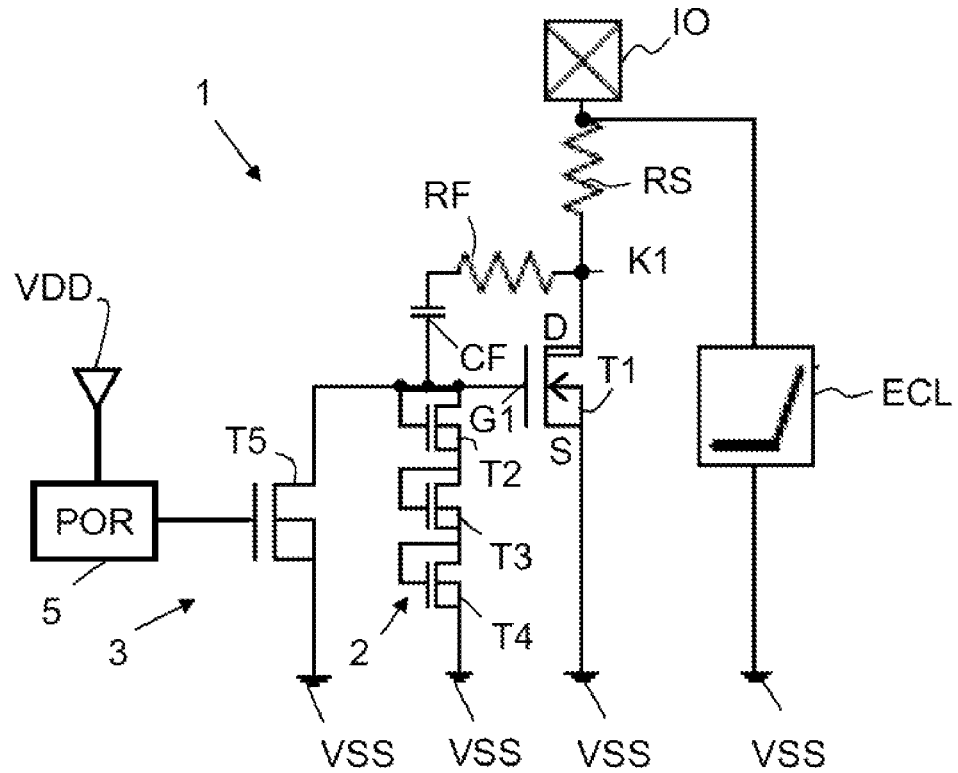
Figure 4:
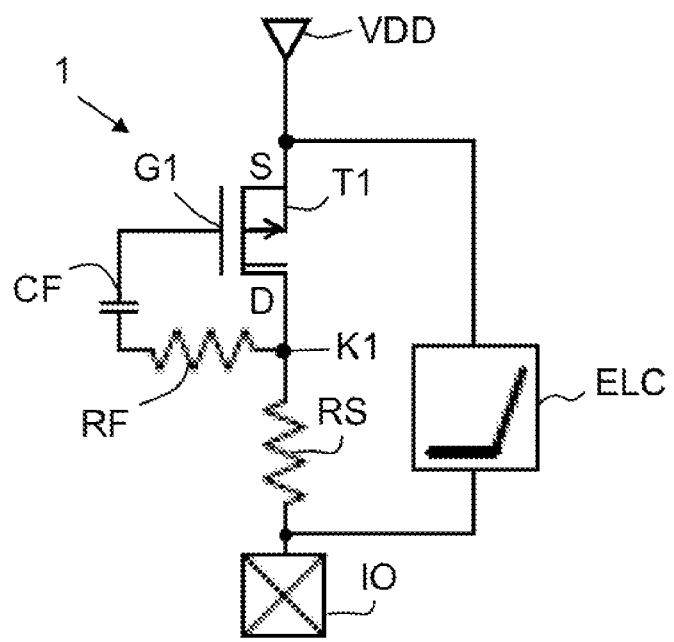

In these figures:

FIG. 1 shows an embodiment of a circuit arrangement for protecting against electrostatic discharges, FIG. 2 shows another embodiment of a circuit arrangement for protecting against electrostatic discharges, FIG. 3 shows another embodiment of a circuit arrangement for protecting against electrostatic discharges, and FIG. 4 shows another embodiment of a circuit arrangement for protecting against electrostatic discharges.

FIG. 1 shows an embodiment of a circuit arrangement for protecting against electrostatic discharges, in which a diverter ECL is connected between a first terminal IO and a second terminal VSS. For example, the first terminal is an input/output terminal while the second terminal VSS is a reference potential terminal or ground terminal. Furthermore, a compensation device 1 is connected between the first and the second terminal IO, VSS, wherein said compensation device features a series circuit of a first resistor RS and an n-channel field effect transistor T1. In this case, a first terminal of the first resistor is connected to the first terminal IO, and a second terminal of the first resistor is connected to the drain terminal of the transistor T1 while the source terminal of the transistor T1 is connected to the second terminal VSS. A junction K1 between the first resistor RS and the transistor T1 is connected to the gate terminal G1 of the transistor T1 via an RC series circuit of a second resistor RF and a capacitor CF.

The diverter ECL is designed for diverting an electrostatic discharge between the first terminal IO and the second terminal VSS that occurs, for example, due to an ESD event. For this purpose, the diverter features, for example, a conventional bypass transistor realized in accordance with the field effect or bipolar technology or another known semiconductor element for diverting high voltages. In different embodiments, such a diverter may furthermore comprise a corresponding trigger device that causes an activation of the diverter when a corresponding voltage is applied or when a corresponding pulse occurs at the first terminal IO.

When the operability of the diverter ECL is tested, as well as when an actual ESD pulse occurs at the first terminal IO, a so-called pre-charge may occur at the first terminal IO, for example, due to the approach of a charged source such that a pre-charge voltage forms at the first terminal IO. In comparison with an ESD pulse that usually occurs rapidly, such a pre-charge voltage only has low frequency components. The RC series circuit RF, CF is in this case dimensioned in such a way that the lower frequency components of the pre-charge voltage reach the gate terminal G1 of the transistor T1 via the capacitor CF that acts as a Miller capacitance and activate the controlled path of the transistor T1. The pre-charge or the pre-charge voltage can then flow to the second terminal VSS via the first resistor RS and the open transistor T1. The voltage at the first terminal is accordingly reduced to at least the threshold voltage of the transistor T1.

When the actual ESD pulse occurs after or simultaneously with the diversion of the pre-charge voltage, it can be better detected by the diverter such that a diversion of the ESD pulse takes place with high reliability. In addition, the triggering in the diverter can take place more rapidly such that a potential error status due to the ESD pulse is quickly eliminated. The voltage caused by the ESD pulse cannot reach the gate terminal G1 due to the filter effect of the RC series circuit RF, CF such that an undesirable activation of the transistor T1 does not occur at the actual ESD pulse.

In different embodiments, the RC circuit RF, CF is dimensioned, in particular, in such a way that neither an ESD pulse nor an edge of a pulsed useful signal at the first terminal IO leads to an activation of the transistor T1. For this purpose, particularly a time constant of the RC series circuit RF, CF that acts as a low-pass filter is chosen such that this time constant respectively is greater or longer than an expected rise time of a clock pulse edge or of an ESD pulse by dimensioning the resistor and the capacitor accordingly. Furthermore, a capacitance between the gate and the drain of the transistor T1 can also be taken into consideration in the dimensioning of the RC series circuit RF, CF. The RC series circuit RF, CF accordingly acts as a low-pass filter, particularly between the first terminal and the gate terminal G1.

The RC circuit RF, CF makes it possible, in particular, to route transient components of a pre-charge voltage at the first terminal IO to the gate terminal G1 in order to activate the field effect transistor T1 and divert the pre-charge voltage.

For example, a value of no more than 1 kΩ is chosen for the first resistor RS in order to realize a current limiting for the field effect transistor T1, as well as to allow a sufficient and reliable diversion of an overvoltage. For example, the first resistor RS that causes a current limiting for the controlled path of the field effect transistor also prevents a voltage snapback of the field effect transistor T1.

FIG. 2 shows another embodiment of a circuit arrangement for protecting against electrostatic discharges that represents, in particular, an enhancement of the embodiment illustrated in FIG. 1. As a supplement to the elements illustrated in FIG. 1, the compensation device 1 features a voltage limiter 2 that is connected between the gate terminal G1 of the transistor T1 and the second terminal VSS. The voltage limiter 2 features a series circuit of several transistors T2, T3, T4 that are wired in the form of a diode. The transistors T2, T3, T4 are realized, for example, in the form of n-channel field effect transistors.

The compensation device 1 furthermore comprises a deactivation device 3 with a switching transistor T5 that connects the gate terminal G1 to the second terminal VSS. The switching transistor T5 is in a current mirror wired to an additional transistor T6, the controlled path of which is fed by a bias current source 4. The bias current source 4 is connected to a supply voltage terminal VDD.

The current limiter 2 or the transistors T2, T3, T4 make it possible for the gate voltage at the gate terminal G1 to increase only to a value that corresponds to the sum of the conducting-state voltages of the transistors T2, T3, T4. In this way, an increase in the gate voltage at the gate terminal G1 can be prevented from exceeding a permissible gate breakdown voltage, at which a gate oxide layer of the transistor T1 is damaged or destroyed. This type of voltage limiting may be particularly desirable if voltages that exceed the aforementioned gate breakdown voltage of the transistor T1 can also occur during the regular operation of the circuit arrangement or of an integrated circuit to be protected.

Although only three transistors T2, T3, T4 are illustrated in the present embodiment, the voltage limiting may also be defined by connecting additional transistors in series, wired in the form of a diode in order to reach a desired limiting voltage.

It is also possible to forgo the voltage limiter 2 if the transistor T1 is dimensioned accordingly, particularly with respect to its gate breakdown voltage.

The deactivation device 3 makes it possible to produce a low-resistance connection between the gate terminal G1 and the second terminal VSS by activating the transistor T5. In this way, an activation of the transistor T1 and the formation of a conductive cable are prevented. The compensation device 1 is accordingly deactivated with respect to the diversion capability.

For example, it is desirable to prevent a diversion of voltages at the first terminal IO during the operation of the integrated circuit to be protected. For this purpose, a corresponding bias current is generated by means of the bias current source 4 when a corresponding supply voltage is applied to the supply voltage terminal VDD, wherein said bias current causes an activation of the transistor T6, as well as of the transistor T5 due to the current mirror circuit. The compensation device 1 is therefore deactivated when a corresponding bias current is available as deactivation signal or when a corresponding supply voltage is available.

The deactivation device 3 may, in particular, also be advantageous if the compensation device 2 is only functional in the non-installed state of a circuit to be protected. In the non-installed state, no deactivation signal is available due to the lack of a supply voltage such that the compensation device 1 is active. Overvoltages caused by pre-charges in advance of an actual ESD pulse can therefore be diverted while an automatic deactivation of the compensation device 1 respectively takes places by means of the circuit arrangement due to the available supply voltage after the installation or during the operation of the integrated circuit.

FIG. 3 shows another embodiment of a circuit arrangement for protecting against electrostatic discharges that respectively represents an enhancement of the embodiment illustrated in FIG. 1 and a modification of the embodiment illustrated in FIG. 2. In contrast to the embodiment illustrated in FIG. 2, the deactivation device 3 only features the switching transistor T5 that is connected between the gate terminal G1 and the second terminal VSS. The switching transistor T5 is controlled by a Power-on-Reset circuit 5 that generates a corresponding signal in the form of a deactivation signal for the deactivation device 3 or the switching transistor T5 when a sufficient supply voltage is available at the supply voltage terminal VDD. In other respects, the deactivation principle in the embodiment illustrated in FIG. 3 corresponds to the principle described with reference to FIG. 2.

In the above-described embodiments, the series circuit of the first resistor RS and the field effect transistor T1 is connected between an input/output terminal and a reference potential terminal, wherein the transistor T1 is realized in the form of an re-channel field effect transistor. However, a p-channel field effect transistor may also be used in different embodiments and modifications, wherein a corresponding adaptation of the polarities must be taken into consideration.

FIG. 4 shows an embodiment of a circuit arrangement for protecting against electrostatic discharges that represents a modification of the embodiment illustrated in FIG. 1. In this case, the field effect transistor T1 is realized in the form of a p-channel field effect transistor, the source terminal of which is connected to the supply voltage terminal VDD. The supply voltage terminal VDD simultaneously forms the second terminal while the first terminal IO is once again realized in the form of an input/output terminal. The first resistor RS, the diverter ECL and the RC series circuit RF, CF correspond to the respective elements in the embodiments described above.

Accordingly, the function and the operation of the embodiment illustrated in FIG. 4 are also identical or similar to the embodiment illustrated in FIG. 1 in consideration of the changed polarity. The modifications or expansions illustrated in FIG. 2 and FIG. 3, particularly the voltage limiter 2 and the deactivation device 3, can also be supplemented in the embodiment illustrated in FIG. 4.

What is claimed is:

1. A circuit arrangement for protecting against electrostatic discharges, the circuit arrangement comprising:
 a diverter that is suitable for diverting an electrostatic discharge between a first terminal and a second terminal; and
 a compensation device, wherein a series circuit of a first resistor and a field effect transistor is connected between the first terminal and the second terminal, wherein a junction between the first resistor and the field effect transistor is connected to the gate terminal of the field effect transistor via an RC series circuit, wherein the RC series circuit comprises a second resistor and a capacitor and acts as a low-pass filter between the junction and the gate terminal, and wherein a time constant of the RC series circuit is dimensioned in such a way that the time constant is longer than a rise time of an expected pulse of an electrostatic discharge at the first terminal.

2. The circuit arrangement according to claim 1, wherein the compensation device features a voltage limiter that is connected between the gate terminal of the field effect transistor and the second terminal, and is designed for maintaining a gate voltage of the field effect transistor lower than a gate breakdown voltage of the field effect transistor.

3. The circuit arrangement according to claim 2, wherein the voltage limiter features a series circuit of several transistors that are wired in the form of a diode.

4. The circuit arrangement according to claim 1, comprising a deactivation device configured to connect the gate terminal of the field effect transistor to the second terminal, particularly in a low-resistance fashion, based on a deactivation signal.

5. The circuit arrangement according to claim 4, wherein the deactivation device features a switching transistor that connects the gate terminal of the field effect transistor to the second terminal.

6. The circuit arrangement according to claim 5, wherein the switching transistor is controllable by means of a bias current.

7. The circuit arrangement according to claim 5 or 6, wherein the switching transistor is controllable based on a voltage at a supply voltage terminal (VDD).

8. The circuit arrangement according to claim 1, wherein the RC series circuit is dimensioned in such a way that a pulse of an electrostatic discharge at the first terminal is filtered away with respect to the gate terminal of the field effect transistor.

9. The circuit arrangement according to claim 1, wherein the RC series circuit is dimensioned in such a way that an edge of a useful signal at the first terminal is filtered away with respect to the gate terminal of the field effect transistor.

10. The circuit arrangement according to claim 1, wherein the time constant of the RC series circuit is dimensioned such that the time constant is longer than a known rise time of an edge of a payload signal at the first terminal.

11. The circuit arrangement according to claim 1, wherein the first terminal is an input/output terminal and the second terminal is a reference potential terminal or a supply voltage terminal.

12. The circuit arrangement according to claim 1, wherein the first resistance has a value of no more than 1 kΩ.

13. The circuit arrangement according to claim 1, wherein the rise time of the expected pulse is 20 nsec.

14. The circuit arrangement according to claim 9, wherein a rise time of the useful signal is known in advance.

* * * * *